United States Patent [19]

Kitada et al.

[11] Patent Number: 4,596,646

[45] Date of Patent: Jun. 24, 1986

[54] THIN-FILM PERMANENT MAGNET AND METHOD OF PRODUCING THE SAME

[75] Inventors: Masahiro Kitada; Hiroshi Yamamoto, both of Tokyo; Masahide Suenaga, Odawara; Noboru Shimizu, Tokorozawa, all of Japan

[73] Assignee: Hitachi, Ltd., Tokyo, Japan

[21] Appl. No.: 469,105

[22] Filed: Feb. 23, 1983

[30] Foreign Application Priority Data

Feb. 26, 1982 [JP] Japan .................................. 57-29028

[51] Int. Cl.[4] .............................................. C23C 14/00

[52] U.S. Cl. ............................ 204/192 M; 204/192 C

[58] Field of Search ........................ 204/192 C, 192 M

[56] References Cited

U.S. PATENT DOCUMENTS 4,164,461 8/1979 Schilling ......................... 204/192 C
4,226,681 10/1980 Shirahata et al. ............... 204/192 C
4,328,080 5/1982 Harris .............................. 204/192 C
4,400,255 8/1983 Kisner ............................. 204/192 C
4,411,963 10/1983 Aine ................................ 204/192 C
4,430,183 2/1984 Schuller et al. ................. 204/192 C
4,438,066 3/1984 Aboaf et al. ...................... 148/31.57

OTHER PUBLICATIONS

Metals Handbook, vol. 5, "Surface Cleaning, Finishing, and Coating", Oct. 1982, 9th ed., pp. 412–416.

*Primary Examiner*—John P. Sheehan
*Attorney, Agent, or Firm*—Antonelli, Terry & Wands

[57] ABSTRACT

A thin-film permanent magnet which is made of a Co-Pt alloy containing 5–35 atomic-% of Pt. This thin-film permanent magnet can be readily produced by a sputtering method in which the ultimate pressure before the introduction of a sputtering gas is made $5\times10^{-7}$–$1\times10^{-4}$ Torr. Without any heat treatment, it has a coercivity of 2,000 Oe at the maximum and a remanence of about 8,000–about 18,000 G.

8 Claims, 4 Drawing Figures

THIN-FILM PERMANENT MAGNET AND METHOD OF PRODUCING THE SAME

BACKGROUND OF THE INVENTION

The present invention relates to a thin-film magnetic material having a high coercivity, and more particularly to a thin film of high coercivity or thin-film permanent magnet made of a Co-Pt alloy and a method of producing the same.

Magnetic recording techniques employing magnetic discs and magnetic tapes have had the magnetic recording density enhanced every year, and magnetic recording materials and magnetic recording systems have been improved or bettered accordingly.

Regarding the magnetic discs and magnetic tapes which have hitherto been $\gamma Fe_2O_3$ coating media, iron powder coating media and oblique deposition film media of high coercivity are being developed for the magnetic tapes, while $\gamma Fe_2O_3$ film media produced by the combination of sputtering and heat treatment, etc., are being developed for the magnetic discs. Although magnetic characteristics required of permanent magnet films for these magnetic recording media are somewhat different depending upon intended uses, it is a feature that the coercivity and the remanence are greater than those of the conventional materials in any application. In addition, as regards a thin-film magnetoresistance element, there is a method in which a bias field is applied by a permanent magnet film, and also the permanent magnet film for this element is required to be great in the coercivity and the remanence.

Meanwhile, as a bulky Co-Pt-based magnet, there has been known a CoPt magnet which contains 50 atomic-% of Pt, the balance being Co. It is usually quenched at 1,000°-1,200° C., whereupon it is tempered at 600°-850° C. and has the coercivity increased by aging. This is based on the formation of the ordered phase of CoPt, and can be realized in only a composition range very close to the aforementioned composition. It is said that the CoPt ordered-type permanent magnet can be produced also in the form of a thin film. According to Japanese Laid-Open Patent Application No. 50-140899, a thin film made up of 70-85 weight-% of Pt and 35-15 weight-% of Co can have the coercivity increased by an ordering treatment similar to that of the bulky material described above, and the maximum value of 2,300 Oe is obtained as the coercivity. There is also an example in which a Co-Pt film has been formed by a plating process (V. Tutovan; *Thin Solid Films,* 61 (1979), 133), but the coercivity is, at most, approximately 300 Oe. This is not considerably different from the magnitudes of the coercivity of the Co simple substance which are obtained by adjusting the atmosphere of evaporation, etc., and an effect based on the addition of Pt cannot be said remarkable.

As described above, the prior art requires the heat treatment in order to produce the thin-film magnetic material having the high coercivity. For this reason, not only the production cost rises, but also a substrate with the magnetic material film deposited thereon is adversely affected by the heat treatment. Further, the magnetic material and the substrate sometimes react due to the heat treatment, resulting in a change in the quality of the magnetic material film.

The following references are cited to show the state of the art; i) Official Gazette of Japanese Laid-Open Patent Application No. 50-140899, ii) *Thin Solid Films,* Vol. 61 (1979), pages 133-140.

SUMMARY OF THE INVENTION

The present invention has for its object to provide a thin film of high coercivity or a thin-film permanent magnet free from the difficulties of the prior art, and to provide an easy method of producing the same.

In order to accomplish the object, the thin-film permanent magnet (which shall cover a thin film of high coercivity in this specification) of the present invention is made of a Co-Pt alloy which contains 5-35 atomic-% of Pt, with the balance being Co. A more preferable Pt content is 10-30 atomic-%, and the most preferable Pt content is 15-25 atomic-%. Pt contents outside the above range are unfavorable because the coercivity of the thin film lowers.

The thin-film permanent magnet of the present invention having the aforementioned composition is preferably made 100-2,500 Å thick, and more preferably 200-1,200 Å. When the film thickness is greater than the above range, the coercivity of the thin film lowers, and when it is less than the range, a discontinuous part tends to arise in the film, so that both the cases are unfavorable. In addition, when the thin-film permanent magnets 1,000-1,200 Å thick and insulating thin films, such as $SiO_2$ films, 200-800 Å thick are alternatively stacked into a multilayer thin film, a thick permanent magnetic film having a thickness of, e.g., 2-3 $\mu$m can be readily obtained.

In order to produce the excellent thin-film permanent magnet, the thin film of the aforementioned composition may be formed on a substrate by the sputtering process. In this case, the sputtering needs to be performed in a sputtering atmosphere obtained by introducing a sputtering gas into a sputtering chamber after the interior of the sputtering chamber has been brought to vacuum conditions under an ultimate pressure of $5\times10^{-7}$-$1\times10^{-4}$ Torr preferably for more than 10 minutes. When the ultimate pressure in the sputtering chamber before the introduction of the sputtering gas becomes a higher vacuum than the above range, the coercivity of the thin film formed lowers, and when the ultimate pressure becomes a lower vacuum than the above range, the thin film formed tends to change in color and to exfoliate from the substrate; so that, in both, the results are unfavorable. A more preferably range of the ultimate pressure is $5\times10^{-7}$-$5\times10^{-5}$ Torr, and the most preferable range is $1\times10^{-6}$-$1\times10^{-5}$ Torr.

The thin-film permanent magnet of the present invention can have the coercivity brought up to 2,000 Oe without any heat treatment. Although the thin-film permanent magnet of the present invention exhibits the excellent magnetic characteristics without any heat treatment, as stated above, a heat treatment may be performed in order to attain more excellent characteristics or specified characteristics.

DESCRIPTION OF THE PRESENTLY PREFERRED EMBODIMENTS

Now, the present invention will be described in detail with reference to examples. in the ensuing description, the term "%" alone shall indicate "atomic-%."

EXAMPLE 1

Figure 1:
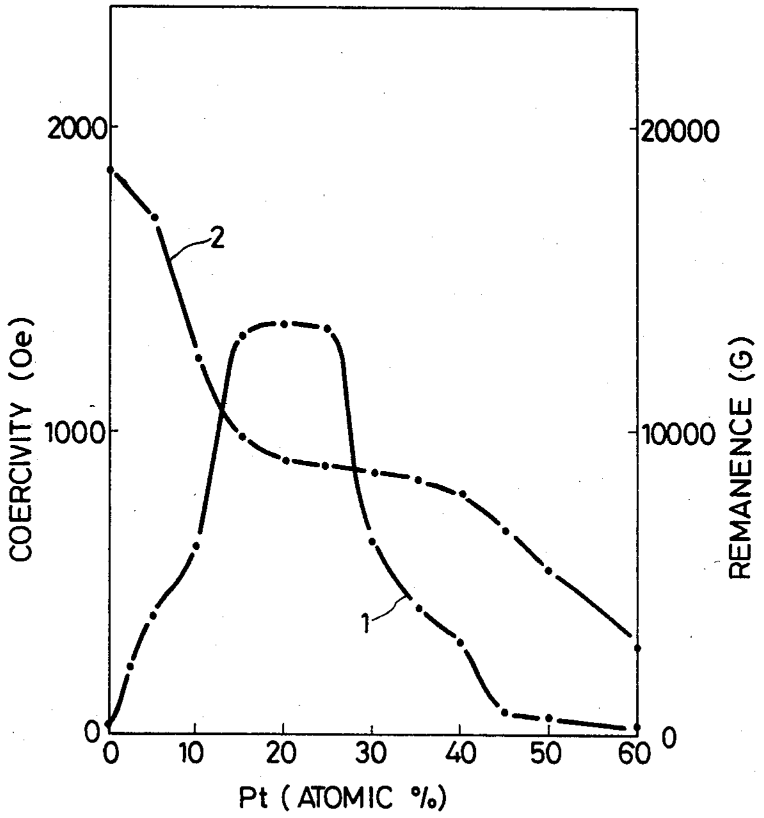
FIG. 1 is a graph showing the Pt content-dependencies of the coercivity and remanence of a Co-Pt alloy-based thin film.

FIG. 1 illustrates the coercivity 1 and remanence 2 of Co-Pt alloy thin films containing 0 to 60 atomic-% of Pt and being 80 nm thick, the films having been formed on substrates of hard glass. Al, Ti, sputtered $SiO_2$ on glass sputtered $Al_2O_3$ on glass, $Al_2O_3$, fused quartz or the like by the well-known sputtering process, employing the target made of pure Pt and Co or made of sintered alloy, under the conditions of 200 W in output power, $5\times10^{-3}$ Torr for the pressure of a sputtering gas consisting of Ar and $1\times10^{-6}$ Torr for the ultimate pressure before the introduction of the sputtering gas. The output power may be 50–300 W. As apparent from FIG. 1, the maximum value of the coercivity of the thin film obtained by sputtering pure Co is as very low as about 30 Oe; whereas the coercivity of the alloy film increases abruptly as about 200 Oe for 2.5% Pt, about 400 Oe for 5% Pt, about 600 Oe for 10% Pt, and about 1,200 Oe for 15% Pt. The coercivity takes the maximum value between 15% and 25% in terms of the Pt content, and it turns to decrease when the value of 25% is exceeded. More specifically, the coercivity of the alloy film is about 600 Oe for 30% Pt and about 300 Oe for 40% Pt. It is 70 Oe for 45% Pt and 30 Oe for 50% Pt, and the effect on the coercivity owing to the further addition of Pt does not appear. As stated before, the magnitude of the coercivity required of a permanent magnet film differs depending upon a device to which the film is applied, but a magnitude of about 500 Oe or greater permits the application satisfactorily as the permanent magnet film. Accordingly, when the sputtering operation is performed under the aforementioned conditions, Co-Pt alloy thin films containing 10 to 30% of Pt are regarded as practical materials. On the other hand, the remanence which is a property required for the permanent magnet film varies as shown in FIG. 1, depending upon the addition of Pt and is decreased by the addition of Pt. Although the magnitude of the required remanence differs depending upon a device to which the film is applied, a value of 5,000 G or greater is usually sufficient. All the above Co-Pt alloy thin films containing 10 to 30% of Pt have the remanences of at least 8,000 G, and can be put into practical use as the permanent magnet films. Co-Pt alloy films containing 5–35% of Pt have coercivities of at least 400 Oe and remanences of at least 8,000 G, and will be practicable for some purposes.

EXAMPLE 2

Figure 2:
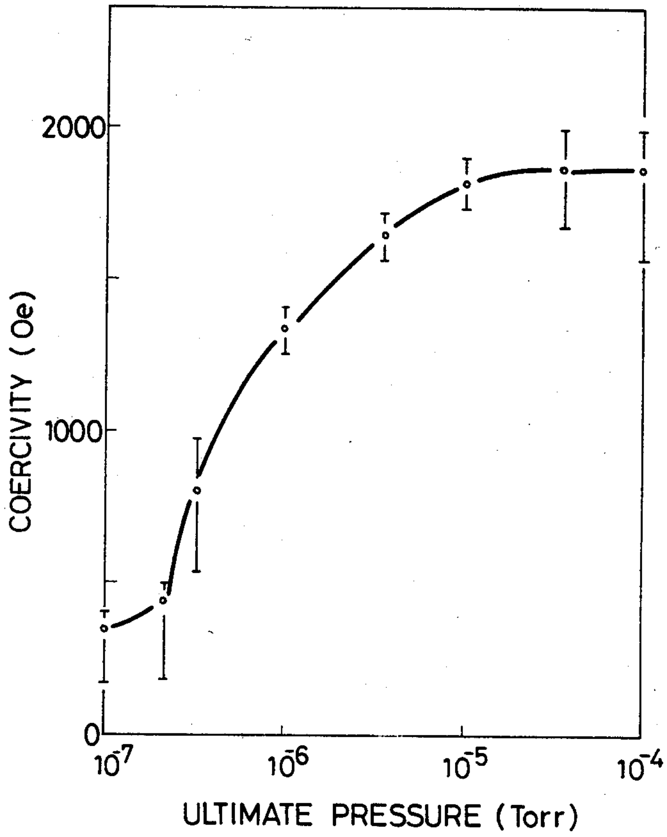
FIG. 2 is a graph showing the relationship between the coercivity of a Co-20 atomic-% Pt thin film and the ultimate pressure before the introduction of a sputtering gas in a sputtering operation.

It has been described heretofore that the coercivity of a Co-Pt thin film is conspicuously affected by the ultimate pressure before the introduction of a sputtering gas in a sputtering operation. FIG. 2 is a graph showing the variation of the coercivity at the time at which a Co-20% Pt alloy was sputtered to a film thickness of 800 Å in an Ar atmosphere and under a sputtering gas pressure of $5\times10^{-3}$ Torr, the ultimate pressure before the introduction of the sputtering gas being $1\times10^{-7}$–$1\times10^{-4}$ Torr. When the ultimate pressure is $1\times10^{-7}$ Torr, the coercivity is 300–400 Oe or less, but when the ultimate pressure becomes $3\times10^{-7}$ Torr, the coercivity becomes 450–500 Oe, and when the ultimate pressure is $5\times10^{-7}$ Torr, the coercivity abruptly increases to 800 Oe. The coercivity increases as the ultimate pressure increases, and the coercivity becomes substantially saturated and reaches 2,000 Oe between $1\times10^{-5}$ Torr and $1\times10^{-4}$ Torr. Supposing that the lowest practical coercivity is 500 Oe, the required ultimate pressure is from $5\times10^{-7}$ Torr to $1\times10^{-4}$ Torr. When the dispersion of the coercivities of thin films produced, etc., are taken into consideration, an ultimate pressure of lower vacuum than $5\times10^{-7}$ Torr is desirable for steadily obtaining the thin films of high coercivity. On the other hand, when the ultimate pressure becomes $1\times10^{-4}$ Torr, such problems arise that the sputtered thin film gives rise to whitish blurs, that it colors in white or brown and changes in quality when let stand in the air by way of example, and that it becomes liable to exfoliate from the substrate. Therefore, the ultimate pressure should more desirably be higher vacuum than $5\times10^{-5}$ Torr. In consideration of the dispersion of coercivities attained, the ease of the sputtering, etc., a value of $1\times10^{-6}$–$1\times10^{-5}$ Torr is the optimum as the ultimate pressure.

Figure 3:
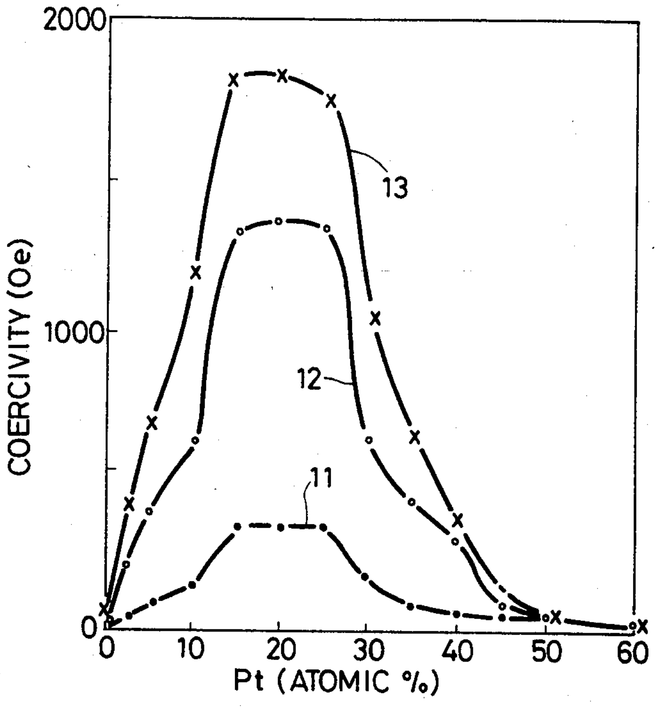
FIG. 3 is a graph showing the relationships between the coercivity and Pt content of a Co-Pt alloy thin film in the cases of changing the ultimate pressure before the introduction of a sputtering gas in a sputtering operation.

FIG. 3 illustrates the influence of the ultimate pressure on the coercivity of Co-Pt alloy thin films containing 0–60 atomic-% of Pt and formed by sputtering. In FIG. 3, a curve indicated by numeral 11 represents the coercivity of the Co-Pt alloy sputtered under the condition of $1\times10^{-7}$ Torr in terms of the ultimate pressure before the introduction of a sputtering gas, a curve 12 represents the coercivity under $1\times10^{-6}$ Torr, and a curve 13 represents the coercivity under $1\times10^{-5}$ Torr. As seen from the graph, when the ultimate pressure is $1\times10^{-7}$ Torr, the coercivity is 300–400 Oe or less in the whole Pt content range in the figure. When the utlimate pressure lies in a range of $1\times10^{-6}$–$1\times10^{-5}$ Torr, coercivity values of 400–500 Oe or greater are attained between 5–10 atomic-% and 30–35 atomic-% in terms of Pt atomic-%. Accordingly, a range of 5–35 atomic-% of Pt is deemed to include the practicable values as the composition of the Co-Pt-based alloy. In consideration of the deviation of sputtering conditions, etc., a composition range of 10–30 atomic-% of Pt is more preferable for steadily obtaining a Co-Pt alloy thin film of high coercivity. Further, in consideration of the Co-Pt composition-dependency, a Co-Pt alloy thin film of very stable characteristics can be obtained in a composition range of 15–25 atomic-% of Pt. The conditions of operation and the Pt content of the alloy in the present example, other than mentioned above, were the same as in Example 1.

EXAMPLE 3

Figure 4:
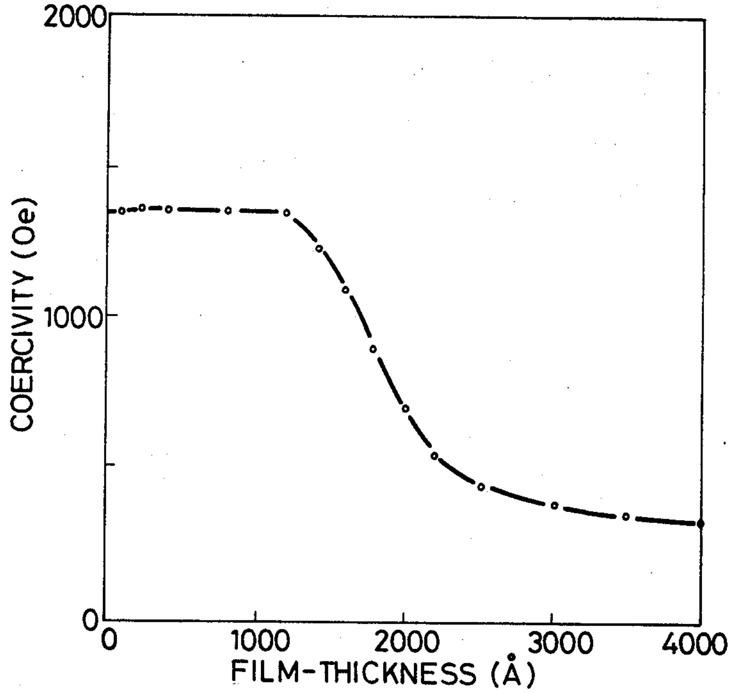
FIG. 4 is a graph showing the relationship between the coercivity and thickness of a Co-20 atomic-% Pt thin film.

Although the remanence of a Co-Pt-based alloy thin film is not affected by sputtering conditions such as the aforementioned ultimate pressure, the thickness of the film, etc., the coercivity is greatly influenced by these conditions as described heretofore. FIG. 4 shows the relationship betweeen the coercivity and the film thickness at the time at which Co-20 atomic-% Pt alloy thin films were sputtered under $1\times10^{-6}$ Torr in terms of the ultimate pressure before the introduction of a sputtering gas. When the film thickness is 100–1,200 Å, the coercivity does not change. When a value of 1,200 Å is reached, the coercivity lowers gradually. The coercivity becomes 700 Oe at 2,000 Å, and 400 Oe at 2,500 Å. At greater thicknesses, the coercivity approaches an approximately constant value. As described before, when the coercivity is low, practicability as the permanent magnet film is lost. Therefore, a film thickness of about 2,500 Å is the effective maximum thickness as the permanent magnet film. In order to steadily obtain thin films of stable characteristics, however, a value of, at most, 1,200 Å is desirable. On the other hand, in a region of smaller film thicknesses, the constant coercivity is attained down to 100 Å. Since, however, a film is yet made up of island-like crystal grains at 100 Å, a thickness greater than 100 Å is required, and a value of at least 200 Å at which a continuous film is formed is more desirable. As permanent magnet films for a magnetic disc, a magnetic tape and a magnetoresistance element, the thickness of 200–1,200 Å affording the steady characteristics suffice for practical use. In an application of still greater film thickness, after a Co-Pt alloy thin film has been sputtered to a thickness of 1,000–1,200 Å, a thin film of an insulator such as $SiO_2$ is deposited for insulation, whereupon a Co-Pt alloy thin film is deposited. In this manner, both the sorts of thin films are alternately stacked into a multilayer film. Then a permanent magnet film having a total film thickness of, at most, 2–3 m is readily obtained. Even when the Pt content of the Co-Pt-based alloy is changed, the film thickness-dependency of the coercivity hardly changes. Therefore, similar conditions are desirable for the aforementioned Co-Pt films of 5–35% of Pt.

The conditions of operation and the content of Pt in the alloy in the present example, other than mentioned above, were the same as in Example 1.

EXAMPLE 4

Co-Pt alloy thin films of the same composition as in Example 1 were formed under the same conditions as in Example 1 except that the sputtering power was varied over 50–500 W and that the pressure of the sputtering gas (Ar) was varied over $1\times10^{-2}$–$1\times10^{-3}$ Torr. The coercivities and remanences of the films having thicknesses of about 80 nm are similar to those in Example 1, and the magnetic characteristics of the Co-Pt thin films do not appear to depend upon these sputtering conditions.

As understood from the foregoing examples, thin films obtained by sputtering a Co-Pt alloy containing 5–35 atomic-% of Pt, under conditions as stated in the examples, exhibit the maximum coercivity of 2,000 Oe and a remanence of about 8,000–about 18,000 G, and the films have good enough magnetic characteristics to be put into practical use as recording media for a magnetic disc and a magnetic tape and as permanent magnet films for thin-film magnetic devices such as a magnetoresistance element. The above coercivity is equivalent to the coercivity of the prior art ordered type alloy. In addition, since a heat treatment such as tempering is unnecessary, a change in the quality of the film is not caused by a reaction with a substrate, and the production cost of the film can be remarkably lowered. Moreover, the film of the invention is much higher in the coercivity than a film produced by plating. It does not require production in a complicated system for the plating, and makes it possible to obtain a film of good characteristics very simply. Another advantage is that the film is not subject to corrosion attributed to a residual plating solution, etc., so a film of high reliability is obtained.

Obviously many modifications and variations of the present invention are possible in the light of the above teachings. It is, therefore, to be understood that within the scope of the appended claims, the invention may be practiced otherwise than as specifically described.

What is claimed is:

1. A method of producing a thin-film permanent magnet which comprises forming a thin film of a Co-Pt alloy containing 5–35 atomic-% of Pt and a balance of Co on a substrate by sputtering, using a target including Pt and Co, in a sputtering atmosphere which has been obtained by placing the interior of a sputtering chamber at vacuum under a pressure of $1\times10^{-5}$–$5\times10^{-5}$ Torr and, thereafter, introducing a sputtering gas into said chamber, whereby a thin-film permanent magnet having a coercivity of at least 500 Oe can be provided without any heat treatment, which magnet is free of whitish blurs and has a substantially saturated coercivity.

2. A method of producing a thin-film permanent magnet according to claim 1, wherein the substrate is made of glass, Al or Ti.

3. A method of producing a thin-film permanent magnet according to claim 1, wherein the sputtering gas comprises argon gas and sputtering is effected under pressure varying from $1\times10^{-2}$ to $1\times10^{-3}$ Torr employing a target consisting essentially of Co and Pt.

4. A method of producing a thin-film permanent magnet according to claim 1, wherein said film has a coercivity of at least 400 Oe and a remanence of at least 8,000 G without any heat treatment.

5. A method of producing a thin-film permanent magnet according to claim 1, wherein the Pt content of said Co-Pt alloy is 10–30 atomic-%.

6. A method of producing a thin-film permanent magnet according to claim 1, wherein the Pt content of said Co-Pt alloy is 15–25 atomic-%.

7. A method of producing a thin-film permanent magnet according to claim 1, wherein said film has a thickness of 100–2500 Å.

8. A method of producing a thin-film permanent magnet according to claim 1, wherein said film has a thickness of 200–1200 Å.

* * * * *